United States Patent [19]
Bruckner et al.

[11] Patent Number: 5,525,181
[45] Date of Patent: Jun. 11, 1996

[54] METHOD OF MANUFACTURING A MULTILAYER PRINTED CIRCUIT BOARD HAVING FIRST AND SECOND CONDUCTING PATTERNS CONNECTED THROUGH AN ADHESIVE LAYER AND LAMINATE FOR THE MANUFACTURE OF SUCH A PRINTED CIRCUIT BOARD

[75] Inventors: Helmut Bruckner, Eitorf; Siegfried Kopnick, Troisdorf; Werner Uggowitzer, Ferlach, all of Austria

[73] Assignee: U.S. Philips Corporation, New York, N.Y.

[21] Appl. No.: 310,825

[22] Filed: Sep. 22, 1994

Related U.S. Application Data

[62] Division of Ser. No. 966,796, Oct. 27, 1992.

[30] Foreign Application Priority Data

Oct. 31, 1991 [AT] Austria ................................. 2172/91

[51] Int. Cl.⁶ ............................. H05K 1/00; B32B 31/10
[52] U.S. Cl. ......................... 156/298; 156/299; 156/300; 156/309.6; 156/324.4; 29/846
[58] Field of Search .............................. 29/846; 156/299, 156/300, 298, 309.6, 324.4

[56] References Cited

U.S. PATENT DOCUMENTS 2,958,120  5/1956  Taylor ........................................ 156/298
4,528,064  7/1985  Ohsawa et al. .

Primary Examiner—Michael W. Ball
Assistant Examiner—Sam Chuan Yao
Attorney, Agent, or Firm—Ernestine C. Bartlett

[57] ABSTRACT

Two-layer or multilayer printed circuit board, method of manufacturing such a printed circuit board, and laminate for the manufacture of such a printed circuit board by such a method.

A two-layer or multilayer printed circuit board (1) comprises a support plate (2) which consists of a basic material and which carries a first conductor pattern (3) and a second conductor pattern (17) connected to the support plate (2) via an adhesive layer (11) consisting of an electrically insulating adhesive material. At least one opening (12, 13) is provided in the adhesive layer (1 1), which opening leads to a connecting section (4, 5) of the first conductor pattern (3) and to which a connecting section (18, 19) of the second conductor pattern (17) extends, and by means of which the connecting sections (4, 5, 18, 19) of the two conductor patterns (3, 17) can be electrically interconnected by means of an electrically conducting material connection (28, 29). The adhesive layer (11) consists of an adhesive material which in a certain temperature range has a higher hardness than the region (2a) of the support plate (2) adjoining the first conductor pattern (3), and the first conductor pattern (3) is pressed into the support plate (2) by the adhesive layer (11) exclusively in its region covered by the adhesive layer (11) as a result of a pressing process for joining together the adhesive layer (11) and the support plate (2), while the region of each connecting section (4, 5) of the first conductor pattern (3) surrounded by an opening (12, 13) is given a curved shape in the direction of a connecting section (18, 19) of the second conductor pattern (17).

13 Claims, 1 Drawing Sheet

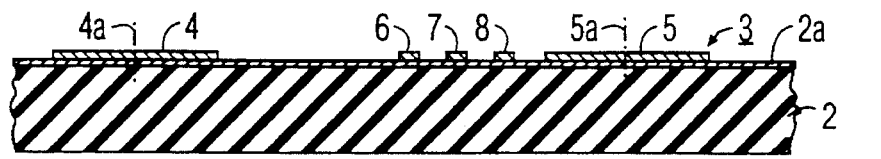
FIG. 1
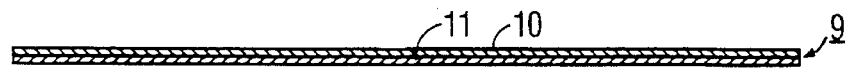
FIG. 2
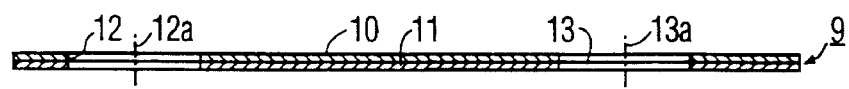
FIG. 3
FIG. 4
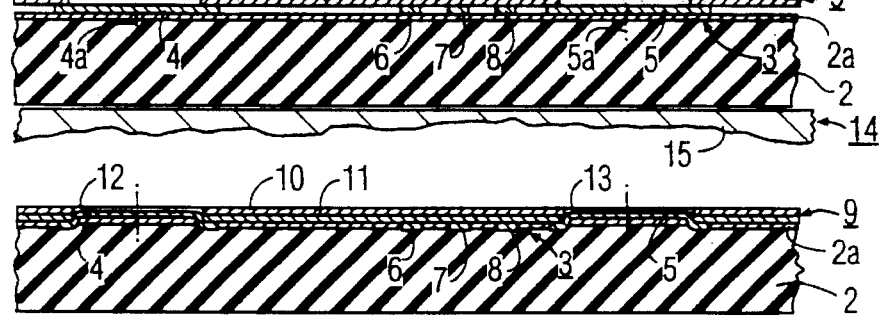
FIG. 5
FIG. 6
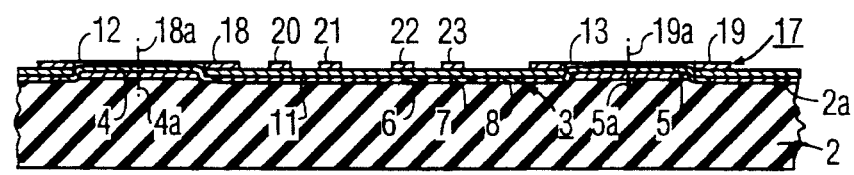
FIG. 7
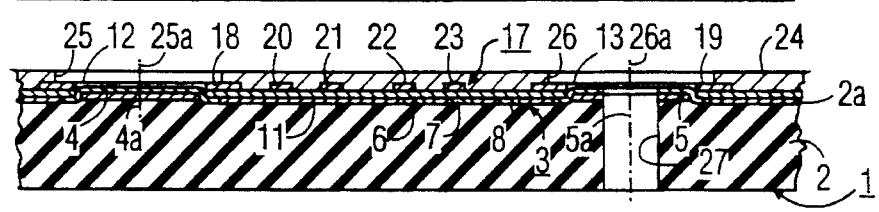
FIG. 8
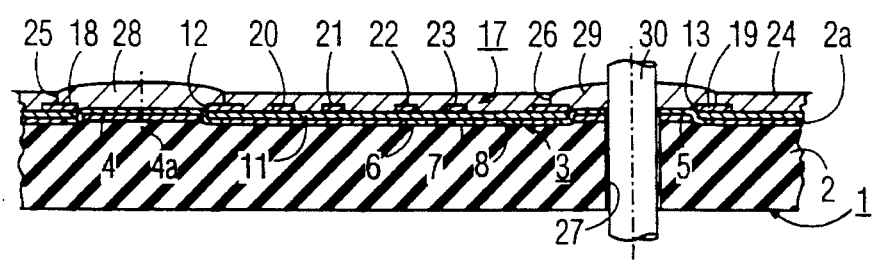
FIG. 9
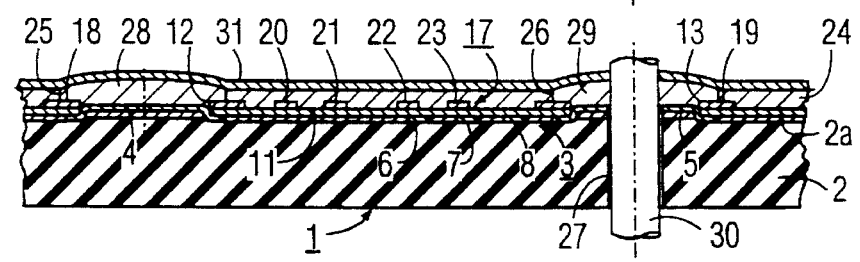

METHOD OF MANUFACTURING A MULTILAYER PRINTED CIRCUIT BOARD HAVING FIRST AND SECOND CONDUCTING PATTERNS CONNECTED THROUGH AN ADHESIVE LAYER AND LAMINATE FOR THE MANUFACTURE OF SUCH A PRINTED CIRCUIT BOARD

This is a division of application Ser. No. 07/966,796, filed Oct. 27, 1992.

FIELD OF THE INVENTION

The invention relates to an improvement to a two-layer or multilayer printed circuit board, which board comprises a support plate and a first conductor pattern connected to the support plate at one side thereof and comprising connecting sections and on which board a second conductor pattern with-connecting sections is connected to the support plate at the side of the first conductor pattern via an adhesive layer consisting of an electrically insulating adhesive material, at least one opening being provided in the adhesive layer, which opening leads to a connecting section of the first conductor pattern and up to which a connecting section of the second conductor pattern extends and through which opening the connecting section of the first conductor pattern and the connecting section of the second conductor pattern can be electrically interconnected by means of a connection of an electrically conducting material, which connection consists of a material which can be distributed in a soft state over the connecting sections to be electrically interconnected. Such a conventional printed circuit board is known, for example, from DE-OS 31 52 603, which corresponds substantially to U.S. Pat. No. 4,528,064.

The invention further relates to an improvement to a method of manufacturing such a printed circuit board whereby a support plate is provided at one side thereof with a first conductor pattern comprising connecting sections, and whereby a laminate comprising a conductor layer for the manufacture of a second conductor pattern with connecting sections and comprising an adhesive layer consisting of an electrically insulating adhesive material is provided with at least one opening through the conductor layer and the adhesive layer, which opening is provided so as to correspond to a connecting section of the first conductor pattern, and whereby subsequently the laminate provided with the at least one opening is connected to the support plate at the side thereof comprising the first conductor pattern by means of the laminate's adhesive layer in a pressing process with heating, during which each opening corresponds to a connecting section of the first conductor pattern, and whereby subsequently the second conductor pattern with its connecting sections is manufactured from the conductor layer of the laminate, such that each individual connecting section of the second conductor pattern extends to an opening in the adhesive layer. Such a conventional method is also known from U.S. Pat. No. 4,528,064.

The invention further relates to an improvement to a conventional laminate for the manufacture of such a printed circuit board by such a method, which laminate comprises a conductor layer and an adhesive layer provided on the conductor layer and consisting of an adhesive material. Such a conventional laminate is also known from U.S. Pat. No. 4,528,064.

BACKGROUND OF THE INVENTION

As stated above, a printed circuit board of the kind described in the first paragraph is known, for example, from U.S. Pat. No. 4,528,064. It is true that said patent indicates in a general way the materials which comprise the support plate and the adhesive layer, but no guidance whatsoever is provided on what properties these materials, especially the materials of the adhesive layer, should have. The support plate and the adhesive layer of the known printed circuit board consist of materials with such properties that all sections, such as conductor tracks, solder pads and solder lands of the first conductor pattern lie at one and the same level in their entirety. Additionally, after the pressing process for connecting the adhesive layer to the support plate, for example, these sections are perfectly plane and lie at a raised level relative to the support plate and project from the support plate at least for a substantial part. In practice there is a risk in the known printed circuit board that the sections of the first conductor pattern are pressed too deeply into the adhesive layer during the said pressing process and consequently the lateral edges of the conductor tracks, solder pads and solder lands, which are comparatively sharp, have pierced through the adhesive layer, given the thickness of the adhesive layer. As a result at least portions of the first conductor pattern have penetrated through the adhesive layer. As a result a disadvantageous short-circuit between the penetrating sections of the first conductor pattern and sections of the second conductor patterns supported by the adhesive layer may arise. To prevent such a penetration of sections of the first conductor pattern through the adhesive layer, a suitably thick adhesive layer could be provided, which, however, is also disadvantageous, especially for obtaining perfect electrically conducting material connections, especially soldered joints, between the connecting sections of the two conductor patterns, and for obtaining the highest possible mechanical strength of the adhesive layer and the lowest possible material cost.

The fact that the sections such as conductor tracks, solder pads and solder lands of the first conductor pattern in their entirety lie at a raised level relative to the support plate may also have the result that the adhesive layer either does not form or forms only an unsatisfactory adhesive connection not only with the conductor tracks, solder pads and solder lands of the first conductor pattern, but also with the regions of the support plate situated adjacent the conductor tracks, solder pads and solder lands. This is disadvantageous especially in the case of a densely arranged first conductor pattern, because then unsatisfactory mutual adhesion between the support plate and adhesive layer may arise over comparatively large surface areas. This may result in gas inclusions which upon subsequent heating, for example during a soldering process for manufacturing the electrically conducting material connections between the connecting sections of the conductor patterns to be electrically interconnected, expand as a result of the high temperatures occurring during such process. Such expansion of gas inclusions disadvantageously leads to an undesirable partial detachment of the adhesive layer from the support plate, and consequently to a removal of the second conductor pattern supported by the adhesive layer from the first conductor pattern, so that in these regions no soldered joints between the connecting sections of the first conductor pattern and the second conductor pattern to be interconnected is achieved.

Moreover, since all sections of the first conductor pattern are perfectly plane in their entirety, in the known printed circuit board, furthermore, the first conductor pattern and the second conductor pattern lie in two comparatively strongly differentiated levels. This may have the result that in the manufacture of a soldered joint as an electrically conducting material connection between a connecting section of the first conductor pattern and a connecting section of the second conductor pattern through an opening in the adhesive layer, (which may take place, for example, in a wave soldering process), the solder does indeed achieve a soldered joint with the exposed connecting section of the second conductor pattern, but does not achieve a soldered joint with the connecting section of the first conductor pattern lying at a deeper level This occurs because of the formation of a gas bubble over the connecting section of the first conductor pattern lying at a deeper level, so that an electrically conducting connection through the soldered joint may not be obtained. The soldering failure then leads to a defective printed circuit board, which must either be discarded or repaired in a separate subsequent soldering process, both being obviously disadvantageous and undesirable. Such a soldering failure is especially disadvantageous when this soldered connection completely covers the connecting section of the first conductor pattern, because in that case the soldering failure with the connecting section of the first conductor pattern cannot be visually observed, so that it cannot be discovered even in an optical product check.

SUMMARY OF THE INVENTION

An object of the invention to avoid the problems described above and to improve a printed circuit board of the kind described in the opening paragraph in such a manner that there is no danger of piercing of the conductor tracks, solder pads and solder lands of the first conductor pattern through the adhesive layer practically independently of the thickness of the adhesive layer. Thus even in the case of a comparatively thin adhesive layer, according to the invention a good mutual adhesion of the adhesive layer and the support plate is safeguarded at all times. Another object of the invention is the provision of a faultless electrically conducting material connection between a Connecting section of the first conductor pattern and a connecting section of the second conductor pattern through an opening in the adhesive layer with a high degree of certainty.

The invention is for this purpose characterized in that the first conductor pattern is completely pressed into the region of the support plate adjoining the first conductor pattern exclusively in its portion covered by the adhesive layer, and each connecting section of the first conductor pattern in its region surrounded by an opening is given a curved shape at least partly through the opening towards the connecting section of the second conductor pattern. As a result, in a particularly simple manner a structure is provided in which the first conductor pattern in its region covered by the adhesive layer lies flush with the support plate and is thus perfectly insulated electrically from the second conductor pattern by the adhesive layer consisting of an electrically insulating adhesive material, wherever this has to be the case. Short-circuits between sections of the first conductor pattern and sections of the second conductor pattern are thus prevented with a high degree of certainty. In addition, the highly important practical advantage is achieved that the electrically insulating adhesive layer has a substantially equal thickness all over its surface area. Since the adhesive layer does not have a reduced thickness anywhere, it provides a continuous and uniform insulation throughout the structure and the further major advantage is achieved that the first and the second conductor pattern uniformly have the same mutual distance, so that the same electrical capacitance conditions uniformly prevail between the two conductor patterns throughout the structure. As a result of the flush arrangement of the region of the first conductor pattern covered by the adhesive layer in the support the adhesive layer bears on the support plate perfectly over substantially its entire surface area, and uniformly forms a good adhesive connection with the support plate, except in the region of the first conductor pattern, so that local gas inclusions and the disadvantageous results thereof are prevented. It is further achieved with a printed circuit board according to the invention that the region of each connecting section of the first conductor pattern surrounded by an opening, which region is given a curved shape towards the second conductor pattern, can lie at almost the same level as the connecting section of the second conductor pattern adjoining the opening. This guarantees with a high degree of certainty that a perfect electrically conducting material connection, preferably formed in a soldering process,-between a connecting section of the first conductor pattern and a connecting section of the second conductor pattern is achieved through an opening in the adhesive layer because the two said connecting sections can lie at almost the same level and thus can be equally well reached by the material of the electrically conducting material connection, When this material is being distributed.

In a particularly preferred embodiment of the invention, the adhesive consists of an adhesive material which has a glass transition temperature in a temperature range of between 50° and 70° C., preferably approximately 60° C., before the connection between the adhesive layer and the support plate is achieved. Such an adhesive material fulfills the requirements set in connection with the present invention to a high degree.

In another preferred embodiment of the invention, the adhesive material of the adhesive layer is formed by an acrylate adhesive. Such an adhesive has the advantage that it is a commercially available adhesive is comparatively inexpensive.

In another preferred embodiment of the invention, the support plate is formed from a laminate of resin-impregnated paper layers and an adhesive layer adjoining the first conductor pattern for retaining the first conductor pattern. Advantageously, such a laminate for the support plate is available in various commercial variants and is comparatively inexpensive.

A method of the kind described hereinabove for manufacturing a printed circuit board according to the invention is characterized in that: (1) an adhesive material is used for the adhesive layer which has a greater hardness in a certain temperature range than the region of the support plate adjoining the first conductor pattern, (2) during the pressing process in said certain temperature range the first conductor pattern is fully pressed into the support plate by the adhesive layer exclusively in its region covered by the adhesive layer, and (3) during the pressing process each connecting section of the first conductor pattern in its region surrounded by an opening is given a curved shape at least partly through the opening towards the connecting section of the second conductor pattern. As a result, in a particularly simple manner, because of the pressure and the heating and the resulting softening of the region of the support plate adjoining the first conductor pattern which starts at a comparatively low-temperature during the pressing process, the first conductor pattern is completely pressed into the region of the support plate adjoining the first conductor pattern. The first conductor pattern is pressed by the adhesive layer which is still harder than the already more softened region of the support plate adjoining the first conductor pattern with its region covered by the adhesive layer of the laminate. Thus, this portion of the first conductor pattern can never pierce through the adhesive layer even during subsequent further softening of the adhesive layer, when the adhesive layer enters into an adhesive connection with the support plate. The creation of short-circuits between sections of the first conductor pattern and sections of the second conductor pattern are prevented with a high degree of certainty by this.

It is further achieved by the method according to the invention that during the pressing process, because of the high pressure and the high temperature which lead to a strong heating-up and softening of at least the region of the support plate adjoining the first conductor pattern during the pressing process, and because of the void formed by each opening during this pressing process, the region of a connecting section of the first conductor pattern surrounded by an opening is not pressed into the support plate. This region of each connecting section of the first conductor pattern is curved towards the second conductor pattern relative to the region of each connecting section covered by the adhesive layer, and accordingly projects into the relevant opening in the adhesive layer. This guarantees that the connecting sections of the first and second conductor patterns to be interconnected can indeed be connected to one another reliably and faultlessly by means of an electrically conducting material connection.

The method according to the invention offers the further advantages that a high-quality two-layer or multilayer printed circuit board can be manufactured in a simple manner and that this method requires only a comparatively small number of process steps.

Preferably, in the method according to the invention, when the pressing process is carded out in a press comprising a press platen and a press ram which are movable relative to one another perpendicularly to the support plate, and a maximum pressure of between 50 and 150 bar, preferably approximately 100 bar, and a maximum temperature of between 110° and 180° C., preferably approximately 150° C., are generated during the pressing process. When such a press is used and when these parameters are observed, the advantages connected with the invention and described above are obtained to a particularly high degree.

Especially preferred is such a method when the pressing process has a total duration of between 20 and 40 minutes, preferably 30 minutes, and a heating process and a cooling-down process are carried out over approximately equal proportions of this total duration. This is advantageous for obtaining particularly good process results and the lowest possible rejection rate of the printed circuit boards.

A laminate of the kind described in the third paragraph for manufacturing a printed circuit board according to the invention by a method according to the invention is characterized according to the invention in that the adhesive material of the adhesive layer has a glass transition temperature which lies in a temperature range of between 50° and 70° C., preferably approximately 60° C. Such a laminate according to the invention can be manufactured in a simple manner as an intermediate product and complies very well with the requirements set for the manufacture of a printed circuit board according to the invention by a method according to the invention.

Preferably, the adhesive material of the adhesive layer is formed by an acrylate adhesive. Such an adhesive has the advantage that it is commercially available and that it is comparatively inexpensive.

BRIEF DESCRIPTION OF THE DRAWINGS

The invention will be described in more detail below with reference to an embodiment represented in the drawing, to which, however, the invention is by no means limited.

FIG. 1 shows in cross-section a portion of a support plate of a two-layer printed circuit board according to the invention, a first conductor pattern being provided on the support plate.

FIG. 2 shows in cross-section a portion of a laminate comprising a copper layer and an adhesive layer which is used in the manufacture of the two-layer printed circuit board according to the invention.

FIG. 3 shows in cross-section the portion of the laminate of FIG. 2, circular holes being provided in the laminate as openings through the copper layer and the adhesive layer.

FIG. 4 shows in cross-section the portion of the support plate of FIG. 1 provided with the first conductor pattern and the portion of the laminate of FIG. 3 provided with the circular openings and laid on the support plate at the side of the first conductor patterns, the one on top of the other lying in a press diagrammatically represented as a press platen and a press ram.

FIG. 5 shows in cross-section a portion of an intermediate product obtained after a pressing process in the press, whereby the laminate provided with circular holes is connected to the support plate.

FIG. 6 shows in cross-section a portion of a further intermediate product obtained from the intermediate product of FIG. 5, comprising a second-conductor pattern formed from the copper layer of the laminate.

FIG. 7 shows in cross-section a portion of a two-way printed circuit board without components obtained from the intermediate product of FIG. 6, a solder-stop lacquer layer being provided at the side having the second conductor pattern, in which solder-stop layer further circular openings are provided corresponding to the openings in the laminate, while a hole continuing through the support plate for accommodating a component connection is provided in the region of an opening and a further opening.

FIG. 8 shows in cross-section a portion of a printed circuit board with components obtained from the printed circuit board without components according to FIG. 7, after a soldering operation for making soldered joints between connecting sections of the two conductor patterns through the openings in the adhesive layer.

FIG. 9 shows in cross-section a portion of a two-layer printed circuit board with components and in its finished state, comprising in addition a protective lacquer layer coveting the soldered joints.

DETAILED DESCRIPTION OF THE PREFERRED EMBODIMENTS

The representation in FIGS. 1 to 7 is on a scale approximately ten times enlarged in relation to the actual dimensions, the layer thicknesses being shown on an even more enlarged scale so as to obtain the highest possible clarity in the drawing.

FIGS. 7, 8 and 9 show a portion of a two-layer printed circuit board 1 according to the invention, FIG. 7 showing the board without components, FIG. 8 with components, and FIG. 9 with components and in its final finished state. The individual process steps for the manufacture of the printed circuit board 1 according to FIGS. 7 to 9 are described below with reference to FIGS. 1 to 9.

FIG. 1 shows a portion of a support plate 2 for the two-layer printed circuit board 1 which is partly shown in FIG. 9 in its finished state. The support plate 2, which has a thickness of approximately 1.6 mm, consists substantially of an base material which is formed by a laminate of resin-impregnated paper layers. This laminate has an adhesive layer 2a at its upper side which serves to retain a continuous copper foil against the laminate forming the support plate 2. The adhesive material of the adhesive layer 2a is an acrylate adhesive in this case with a glass transition temperature of approximately 40° C. The thickness of this adhesive layer 2a is approximately 30 µm. Such a laminate is commercially available, for example, under the designation FR-2, which is a hard paper impregnated with phenolic resin. Also commercially available under the designation FR-3 is a similar laminate made of hard-paper impregnated with epoxy resin. The acrylate adhesive forming the adhesive layer 2a on the support plate 2 has in its non-heated state at room temperature a Shore hardness of, for example, 120 Shore. When this laminate is heated, the laminate and the adhesive layer 2a initially retain their original hardness values. Then they become softer, the adhesive layer 2a having a Shore hardness of, for example, 70 to 80 Shore in a temperature range lying above its glass transition temperature of approximately 40° C., between approximately 40° and 50° C. Upon further heating of these laminates up to a temperature of, for example, 150° C., further softening takes place, the adhesive layer 2a then having a Shore hardness of, for example, 30 to 40 Shore, substantially lower values not being achieved in practice.

As noted above, the adhesive layer 2a on the support plate 2 serves to retain a continuous copper foil. A first conductor pattern 3 may be formed from this copper foil, which has a thickness of 35 µm. This may take place in known manner in a so-called subtractive process such as a silk-screen printing process or a photo-etching process. The provision of the first conductor pattern 3 on a support plate 2 which in that case is without copper foil may also be carried out in a different manner, for example, by a so-called additive process. Two circular solder pads 4 and 5, from which two conductor tracks (not visible in FIG. 1) lead away, as well as three further conductor tracks 6, 7 and 8 are shown of the first conductor pattern 3 in FIG. 1.

FIG. 2 shows a portion of a laminate 9 comprising a conductor layer 10 and an adhesive layer 11. The conductor layer 10 here is formed by a copper foil with a thickness of 35 µm. The term "laminate" is to be understood to mean a product consisting of at least two interconnected layers, the interconnection of which layers need not necessarily take place by a lamination process but may also be achieved in some other manner, for example, through the application of an adhesive to the conductor layer. To the lower side of the copper foil 10 is provided the adhesive layer 11 which consists of an adhesive material which before the connection of the adhesive layer 11 to the support plate 2 has a higher hardness in a certain temperature range than the region adjoining the first conductor pattern 3, i.e. substantially the adhesive layer 2a of the support plate 2 shown in FIG. 1 to which the adhesive layer 11 of the laminate 9 is to be joined in a pressing process under heating and pressure. In the present case, the adhesive layer 11 has a thickness of approximately 40 µm and the adhesive material of the adhesive layer 11 has a glass transition temperature of approximately 60° C., with the adhesive material of the adhesive layer 11 being formed by an acrylate adhesive whose degree of polymerization was so chosen that it has the highest possible glass transition temperature or softening temperature. The acrylate adhesive in its non-heated state at room temperature has a Shore hardness of, for example, 120 Shore. Upon heating, the acrylate adhesive forming the adhesive layer 11 initially retains its original hardness. Then it becomes softer, and this acrylate adhesive then has a Shore hardness of, for example, 70 to 80 Shore in a temperature range lying above its glass transition temperature of approximately 60° C., i.e. between approximately 60° C. and 70° C. Thus the adhesive layer 11 of the laminate 9 has a higher Shore hardness value than the adhesive layer 2a of the support plate 2 in the temperature range between 40° and 50° C. Upon further heating, the Shore hardness of the adhesive layer 11 of the laminate 9 decreases further, so that at a temperature of, for example, 150° C. the adhesive layer 11 of the laminate 9 may have, for example, the same Shore hardness as the adhesive layer 2a of the support plate 2 in this temperature range, for example, a Shore hardness of 30 to 40 Shore.

During the manufacturing process of the printed circuit board 1 according to FIGS. 7 to 9, the laminate 9 of FIG. 2 is provided with openings 12 and 13 which are preferably provided in a stamping process. The openings 12 and 13 in the present case have a circular cross-section and extend both through the copper layer 10 and through the adhesive layer 11. The centers 12a and 13a of the openings 12 and 13 and the centers 4a and 5a of the solder pads 4 and 5 have the same relative positions. A portion of the laminate 9 provided with the openings 12 and 13 is shown in FIG. 3. As is evident from FIGS. 1 and 3, the openings 12 and 13 have a somewhat smaller diameter than the solder pads 4 and 5.

When the manufacture of the printed circuit board 1 according to FIGS. 7 to 9 is continued, the laminate of FIG. 3 provided with the openings 12 and 13 is laid on the upper side of the support plate of FIG. 1 provided with the first conductor pattern 3 in such a manner that the centers 4a and 5a of the solder pads 4 and 5 coincide with the centers 12a and 13a of the openings 12 and 13, as is shown in FIG. 4. The stack comprising the support plate 2 with the first conductor pattern 3 and the laminate 9 is put in a press 14, of which a press platen 15 and a press ram 16 are diagrammatically shown. The support plate 2 and the laminate 9 are accurately positioned relative to one another in the press 14 so that the cross-sectional areas of the openings 12 and 13 lie entirely inside the closed solder pads 4 and 5. In practice, paper layers are inserted between the press platen 15 and the lower side of the support plate 2 and between the press ram 16 and the upper side of the copper foil 10, which paper layers are not shown in FIG. 4 for the sake of simplicity, however, and which serve to sindoth out any unevennesses and which safeguard that both the press platen 15 and the press ram 16 bear fully on the respective printed circuit board regions cooperating therewith. To continue, the press ram 16 and the press platen 15 are moved towards one another and subsequently heated so as to join together the adhesive layer 11 and the support plate 2 in a pressing process under heating and pressure.

A maximum pressure of approximately 100 bar is exerted on the printed circuit board portions lying between the press platen 15 and the press ram 16, during the pressing process and both the press platen 15 and the press ram 16 are heated, as mentioned above, which heating continues until a maximum working temperature of approximately 150° C. has been reached. The support plate 2 with its adhesive layer 2a and the copper layer 10 with the adhesive layer 11 connected thereto are heated in this manner. Since the adhesive layer 11 consists of an adhesive material which has a higher hardness than the region of the support plate 2 adjoining the first conductor pattern in a certain temperature range, i.e. approximately between 40° and 50° C., the first conductor pattern 3 is fully pressed into the support plate 2 exclusively with its region covered by the adhesive layer 11 which is still harder than the region of the support plate 2 adjoining the first conductor pattern during a given period within the total duration of the pressing process, so that the first conductor pattern 3 in the finished printed circuit board 1 of FIGS. 7 to 9 is fully pressed into the support plate 2 by the adhesive layer 11 exclusively in its region covered by the adhesive layer 11. During this downward pressing in the present case, the adhesive material of the adhesive layer 2a is laterally displaced for the major part by the first conductor pattern 3, as is shown in the figures. This takes place because the region of the support plate 2 adjoining the adhesive layer 2a is slightly harder than the adhesive layer 2a during the inward-pressing process. When a different support plate is used whose basic material has a different softening characteristic, the adhesive layer 2a may alternatively not be subject to such a displacement, in which case the adhesive layer 2a will surround the pressed-in portions of the first conductor pattern 3 in a cup shape also after pressing-in. In practice, the pressed-in regions may still project approximately 1 µm to 3 µm from the support plate 2 in the case of a thickness of the first conductor pattern of, for example 35 µm, which, however, can be regarded as negligible. The adhesive layer 11 becomes still softer during further heating, but this has no adverse effects because the first conductor pattern 3 was already pressed into the region of the support plate 2 before, particularly the adhesive layer 2a adjoining the first conductor pattern by the still harder adhesive layer 11. As a result, the first conductor pattern 3 cannot practically penetrate into the softened adhesive layer 11, whereby it is also avoided that short-circuits arise between sections of the first conductor pattern 3 and the second conductor pattern 17 supported by the adhesive layer 11. The said inward pressing process takes place only there where the first conductor pattern 3 is actually covered by the adhesive layer 11. In those regions, accordingly, where no adhesive layer 11 is present, for example at the openings 12 and 13, the first conductor pattern 3 is not pressed into the support plate 2, so that only the outermost circular ring-shaped portions of the solder pads 4 and 5 covered by the adhesive layer 11 are pressed into the support plate 2, whereas the centrally positioned circular portions are at a raised level compared with these ring-shaped portions. During the pressing process, and as a result of the high pressure generated thereby and the strong heating of both the support plate 2 and the adhesive layer 11, and because of the openings 12 and 13 which act as voids and lead to different pressure conditions between the support plate 2 and the region of the openings 12 and 13 in the laminate 9 on the one hand and the remaining portion of the laminate 9 on the other hand, the regions of the support plate 2 lying below the central circular portions of the solder pads 4 and 5 are pressed up relative to the other regions of the support plate 2, which has the result that the central circular portions of the solder pads 4 and 5 are curved upwards relative to their ring-shaped portions and as a result practically project up to the level of the copper foil 10. After the desired maximum working temperature of approximately 150° C. has been reached, this temperature is maintained for a given period, after which a cooling-down of the press platen 15 and the press ram 16 takes place, during which the pressure is indeed maintained to prevent rejection of the printed circuit board intermediate product. The heating process and the cooling-down process take approximately 15 minutes each. An adhesion bond between the adhesive layer 11 and the support plate 2 or the adhesive layer 2a is obtained due to the pressing process.

The intermediate product obtained as a result of the pressing process is partly shown in FIG. 5. As is evident from FIG. 5, the first conductor pattern 3 is completely pressed into the support plate 2 by the adhesive layer 11 exclusively with its region covered by the adhesive layer 11 as a result of the pressing process. The external circular ring-shaped portions of the solder pads 4 and 5 are also pressed into the support plate 2 thereby. The inner circular portions of the solder pads 4 and 5, however, are curved upwards so that these regions lie almost at the same level as the copper layer 10. The solder pads 4 and 5 of curved shape are substantially cup-shaped in the present case; but alternatively they may also have a dome shape. As is visible in FIG. 5, the openings 12 and 13 lead to the solder pads 4 and 5 which here form connecting sections of the first conductor pattern 3.

As is evident from FIG. 6, the manufacture of the printed circuit board 1 according to FIGS. 7 to 9 continues with the generation of a second conductor pattern 17 from the copper layer 10, which may take place, for example, also in a silk-screen printing process or alternatively in a photo-etching process. The regions of the solder pads 4 and 5 accessible through the openings 12 and 13 are then covered with an etch resist lacquer when a silk-screen printing process is used and with a solid photoresist when a photo-etching process is used. Two solder lands 18 and 19, from which two conductor tracks (not visible in FIG. 6) issue, and four further conductor tracks 20, 21, 22 and 23 of the second conductor pattern 17 are visible in FIG. 6. The solder lands 18 and 19 have a circular ring-shaped cross-sectional area in conventional manner, their centers 18a and 19a being aligned with the centers 4a and 5a of the corresponding solder pads 4 and 5 and with the centers 12a and 13a of the corresponding openings 12 and 13, respectively. The solder lands 18 and 19 extend up to the openings 12 and 13 and completely surround the latter. The solder lands 18 and 19 thus form connecting sections of the second conductor pattern 17.

It should be noted that the intermediate product partly depicted in FIG. 6 may also be obtained in a similar form by an alternative method, i.e. in that a laminate provided with a synthetic-resin intermediate layer between the copper layer and the adhesive layer is provided with openings, and the second conductor pattern is already generated from the copper layer of this laminate and that only after this the layered structure of synthetic-resin intermediate layer and adhesive layer then supporting the second conductor pattern is joined to the support plate 2 in a pressing process.

To continue the manufacture of the printed circuit board 1 of FIGS. 7 to 9, the intermediate product partly shown in FIG. 6 is provided with a solder-stop lacquer layer 24 at the side of the second conductor pattern 17, which is also done by a conventional technique. A portion of a printed circuit board 1 without components and provided with a solder-stop lacquer layer 24 is shown in FIG. 7. As can be seen from FIG. 7, further openings 25 and 26, which in this case also have a circular crosssectional area, are provided in the solder-stop lacquer layer 24 so as to correspond to the openings 12 and 13. The centers 25a and 26a of the further openings 25 and 26 in the solder-stop lacquer layer 24 then coincide with the centers 4a and 5a of the solder pads 4 and 5 and with the centers 12a and 13a of the openings 12 and 13 in the adhesive layer 11, and with the centers 18a and 19a of the solder lands 18 and 19. The diameters of the openings 25 and 26 in the solder-stop lacquer layer 24 are slightly smaller than the external diameters but clearly larger than the internal diameters of the circular ring-shaped solder lands 18 and 19.

The printed circuit board 1 without components and provided with the solder-stop lacquer layer 24 is covered with a protective lacquer (not shown in FIG. 7) at the side of the solder-stop lacquer layer 24, which protective lacquer has the property that it becomes liquid during a subsequent soldering process as a result of the heating involved therein and acts as a flux in the soldering process. This protective lacquer layer fulfills the function of protecting the copper zones, such as the solder lands 18 and 19 and the solder pads 4 and 5, which are exposed before a subsequent soldering process, against oxidation.

Subsequently, as is also shown in FIG. 7, holes are provided through the support plate 2, which may be effected in a simple and inexpensive manner in a stamping process, but alternatively also in a drilling process. FIG. 7 shows such a hole with the reference numeral 27. The hole 27 serves to accommodate a cylindrical component connection.

Subsequently, the printed circuit board 1 as yet without components and partly shown in FIG. 7 is provided with components, conventional components with connection wires being provided at the side of the printed circuit board 1 facing downward in FIG. 7 and passed with their component connections through the holes 27, so that the free ends of the component connections will end above the upper side of the printed circuit board 1 shown in FIG. 7. So-called SMD components are provided directly against the upper side of the printed circuit board.

To continue, a desired electrically conducting material connection is provided between on the one hand a solder land 18 or 19 and on the other hand a solder pad 4 or 5. This may take place, for example; in a conventional wave soldering process with the components mentioned above. This offers the advantage that the manufacture of the desired material connections between the solder pads and the solder lands of the two conductor patterns can take place without separate measures by means of the soldering process which is necessarily carried out in any case since it is also used for soldering the component connections to the corresponding conductor track connections.

It is alternatively possible, however, to manufacture electrically conducting material connections between the solder lands 18 and 19 on the one hand and the solder pads 4 and 5 on the other hand before the printed circuit board of FIG. 7 is provided with components in that a polymer silver paste is provided on these connecting sections of the first conductor pattern 3 and the second conductor pattern 17 which are to be interconnected electrically in a separate silk-screen printing process, which silver paste is cured or polymerized in a subsequent hardening process, for example, at a temperature of approximately 150° C. Such a method has the advantage that the desired electrically conducting material connections between the solder pads 4 and 5 and solder lands 18 and 19 provided as the connection sections are already completed before the provision of components, so that these material connections can be checked before the provision of components. Should it become apparent during such a check that the resulting printed circuit board contains defective electrically conducting material connections and should therefore be rejected, then a board without components only need be rejected in this case and not a board provided with components, as would be the case when the desired material connections were not provided until after the provision of components by means of a soldering process.

FIG. 8 shows a portion of a two-layer printed circuit board 1 as obtained after a wave soldering process as mentioned above. In this printed circuit board 1, the solder lands 18 and 19 and the solder pads 4 and 5 are interconnected by respective soldered joints 28 and 29 made be soldering tin, while the one soldered joint 29 fulfills the additional function of electrically connecting a component connection 30 of a component (not shown) both to the solder land 19 and to the solder pad 5.

After the provision of the soldered joints 28 and 29, the two-layer printed circuit board 1 partly shown in FIG. 8 is provided with a covering protective lacquer layer 31 which in the present case covers both the soldered joints 28 and 29 and the solder-stop lacquer layer 24, this is not absolutely necessary. The finished printed circuit board 1 provided with the protective lacquer layer 31 is partly shown in FIG. 9. The protective lacquer layer 31 may be provided as a mechanical protection, but it is alternatively possible to dispense with such a protective lacquer layer when substantially no risk of damage to the printed circuit board in this region exists in the course of further handling of the obtained printed circuit board.

As is evident from FIG. 9, the first conductor pattern 3 of the printed circuit board 1 is pressed into the support plate 2 by the adhesive layer 11 as a result of the pressing process exclusively in its region covered by the adhesive layer 11. It is achieved in this way that no short-circuits can occur between the sections of the first and the second conductor track separated from one another by the adhesive layer 11, because the two conductor patterns 3 and 17 lie at different levels mutually separated by the thickness of the adhesive layer 11. Advantageously, the adhesive layer 11 has a constant thickness over its entire surface area so that an equally perfect insulation and equal electrical capacitance conditions between the sections of the two conductor patterns are safeguarded everywhere. It is furthermore achieved thereby that the adhesive layer 11 throughout its region bears fully on the support plate 2, so that a good adhesive bond between the adhesive layer 11 and the support plate 2 is achieved and undesirable gas inclusions and the concomitant disadvantageous results are prevented. As is also clearly visible in FIG. 9, the first conductor pattern 3 is not pressed into the support plate 2 in the regions of the openings 12 and 13 because of the absence of the adhesive layer 11 in these regions, so that the sections of the first conductor pattern 3 lie at a raised level relative to the support plate 2 in the regions of the openings 12 and 13 and even have a curved appearance, so that they are almost at a level with the sections of the second conductor pattern 17. This is advantageous for achieving perfect soldered joints between the solder pads 4 and 5 and the solder lands 18 and 19, because the solder pads and solder lands to be electrically interconnected are equally well accessible to the liquid soldering tin.

In the embodiment described above, a laminate without support is used or manufacturing the printed circuit board, consisting only of a copper foil and an adhesive layer provided against the copperfoil. However, a laminate with a synthetic support layer may alternatively be used, the synthetic-resin support layer of such a laminate being provided at one side with a copper layer and at the other side with an adhesive layer. Such a laminate has the advantage of a higher mechanical strength, which is often desirable and advantageous. Alternatively, a different support plate with a different construction from that in the described embodiment may be used, for example, a support plate commercially available under the trade name CEM-1. In the embodiment described above, the solder pads provided as connecting sections of the first conductor pattern and the openings in the adhesive layer and the copper layer are all of circular shape. The solder pads and openings, however, may alternatively have a rectangular or square shape. In the embodiment described, the central sections of the solder pads of the first conductor pattern have a curved shape so as to reach up to the level of the second conductor pattern; however, this is not absolutely necessary, the central sections of the curved regions of these solder pads may also remain substantially at the same level at which the entire first conductor pattern lies before the pressing process for the manufacture of a printed circuit board. Instead of circular ring-shaped solder lands, the connecting sections of the second conductor pattern may also be formed simply by widened conductor tracks which extend up to the openings in the adhesive layer. The support plate in the embodiment described above is provided with a first conductor pattern at one side only, a second conductor pattern being laid over the first. The support plate may be provided at its second side with a third conductor pattern whose connecting sections are connected to connecting sections of a fourth conductor pattern which is connected to the support plate at the side of the third conductor pattern by means of a further adhesive layer, the third conductor pattern being pressed into the support plate by the further adhesive layer in its region covered by the further adhesive layer as a result of a pressing process for connecting the further adhesive layer to the support plate.

We claim:

1. A method of manufacturing a printed circuit board which comprises:

providing a support plate connected at one side thereof to a first conductor pattern comprising connecting sections, providing a laminate comprising (i) a conductor layer for the manufacture of a second conductor pattern with connecting sections and (ii) an electrically insulating adhesive layer having at least one opening through the conductor layer and the adhesive layer, which at least one opening corresponds to a connecting section of the first conductor pattern, connecting the laminate provided with the at least one opening to the support plate at the side thereof comprising the first conductor pattern by means of the adhesive layer of the laminate in a pressing process with heating, during which each opening corresponds to a connecting section of the first conductor pattern, and manufacturing the second conductor pattern with its connecting sections from the conductor layer of the laminate, such that each individual connecting section of the second conductor pattern extends to an opening in the adhesive layer, wherein: (1) an adhesive material is used for the adhesive layer which has a greater hardness in a certain temperature range than a region of the support plate adjoining the first conductor pattern, (2) during the pressing process in said temperature range the first conductor pattern is substantially fully pressed into the support plate by the adhesive layer exclusively in a region covered by the adhesive layer, and (3) during the pressing process each connecting section of the first conductor pattern in a region surrounded by an opening is given a curved shape at least partly through the opening towards the connecting section of the second conductor pattern.

2. A method as claimed in claim 1, wherein the pressing process is carried out in a press comprising a press platen and a press ram which are movable relative to one another perpendicularly to the support plate, and a maximum pressure of between 50 and 150 bar, and a maximum temperature of between 110° and 180° C., are generated during the pressing process.

3. A method as claimed in claim 2, wherein the pressing process has a total duration of between 20 and 40 minutes, and a heating process and a cooling-down process are carried out over approximately equal proportions of the total duration.

4. A laminate for the manufacture of a printed circuit board by a method as claimed in claim 1, which comprises a conductor layer and an adhesive layer consisting of an adhesive material and provided on the conductor layer, wherein the adhesive material of the adhesive layer has a glass transition temperature which lies in a temperature range of between 50° and 70° C.

5. A laminate as claimed in claim 4, wherein the adhesive material is an acrylate adhesive.

6. A method as claimed in claim 1, wherein the pressing process is carried out in a press at a maximum pressure of approximately 100 bar, and a maximum temperature of about 150° C.

7. A method as claimed in claim 2, wherein the pressing process has a total duration of about 30 minutes.

8. A method as claimed in claim 6 wherein the first conductor pattern in a region covered by the adhesive layer lies flush with the support plate and is insulated electrically from the second conductor pattern by the adhesive layer.

9. A laminate as claimed in claim 4, wherein the adhesive material has a glass transition temperature of about 60° C.

10. A laminate for the manufacture of a printed circuit board by a method as claimed in claim 10 which comprises a conductor layer and an adhesive layer consisting of an adhesive material provided on the conductor layer, wherein the adhesive material of the adhesive layer has a glass transition temperature which lies in a temperature range of between about 50° C. and 70° C.

11. A method of manufacturing a printed circuit board which comprises:

providing a support plate formed by a laminate having a first adhesive layer at one side connected to a first conductor pattern comprising connecting sections, providing a laminate comprising (i) a conductor layer for the manufacture of a second conductor pattern with connecting sections and (ii) an electrically insulating second adhesive layer having at least one opening through the conductor layer and the second adhesive layer, which at least one opening corresponds to a connecting section of the first conductor pattern, connecting the laminate provided with the at least one opening to the support plate at the side thereof comprising the first conductor pattern by means of the second adhesive layer of the laminate in a pressing process with heating, during which each opening corresponds to a connecting section of the first conductor pattern, and manufacturing the second conductor pattern with its connecting sections from the conductor layer of the laminate, such that each individual connecting section of the second conductor pattern extends to an opening in the second adhesive layer, wherein: (1) an adhesive material is used for the second adhesive layer which has a hardness at a certain temperature range that is greater than the hardness of a region of the support plate adjoining the first conductor pattern comprising the first adhesive layer at the same temperature range, (2) during the pressing process in said temperature range the first conductor pattern is substantially fully pressed into the support plate by the second adhesive layer substantially exclusively in a region covered by the second adhesive layer, and (3) during the pressing process each connecting section of the first conductor pattern at least partly in a region surrounded by an opening is given a curved shape at least partly through the opening towards the connecting section of the second conductor pattern.

12. A laminate for the manufacture of a printed circuit board by a method as claimed in claim 11 which comprises a conductor layer and an adhesive layer consisting of an adhesive material provided on the conductor layer, wherein the adhesive material of the adhesive layer has a glass transition temperature which lies in a temperature range of between about 50° C. and 70° C.

13. A method of manufacturing a printed circuit board which comprises:

providing a support plate formed by a laminate of resin-impregnated paper layers having a first acrylate adhesive layer at one side connected to a first copper pattern comprising connecting sections, the adhesive material of said acrylate adhesive layer having a glass transition temperature of about 40° C.;

providing a laminate comprising (i) a copper layer for the manufacture of a second copper pattern with connecting sections and (ii) an electrically insulating second acrylate adhesive layer having at least one opening through the copper layer and the second acrylate adhesive layer, which at least one opening corresponds to a connecting section of the first copper pattern, the adhesive material of the adhesive layer having a glass transition temperature of about 60° C.;

connecting the laminate provided with the at least one opening to the support plate at the side thereof comprising the first copper pattern by means of the second acrylate adhesive layer of the laminate in a pressing process with heating, during which each opening corresponds to a connecting section of the first copper pattern, and manufacturing the second copper pattern with its connecting sections from the copper layer of the laminate, such that each individual connecting section of the second copper pattern extends to an opening in the second acrylate adhesive layer, wherein: (1) an acrylate adhesive material is used for the second adhesive layer which has a hardness at a temperature between about 40° and 50° C. that is greater than the hardness of a region of the support plate adjoining the first conductor pattern comprising the first acrylate adhesive layer at a temperature between about 40° and 50° C., (2) during the pressing process in said temperature range the first copper pattern is substantially fully pressed into the support plate by the second acrylate adhesive layer exclusively in a region covered by the second acrylate adhesive layer, and (3) during the pressing process each connecting section of the first copper pattern at least partly in a region surrounded by an opening is given a curved shape at least partly through the opening towards the connecting section of the second copper pattern.

* * * * *